US 6,552,424 B2

(12) United States Patent
Farrar

(10) Patent No.: US 6,552,424 B2
(45) Date of Patent: Apr. 22, 2003

(54) ANGLED EDGE CONNECTIONS FOR MULTICHIP STRUCTURES

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/198,791

(22) Filed: Jul. 18, 2002

(65) Prior Publication Data

US 2003/0042616 A1 Mar. 6, 2003

Related U.S. Application Data

(62) Division of application No. 09/944,957, filed on Aug. 30, 2001.

(51) Int. Cl.⁷ .................................................. H01L 23/48
(52) U.S. Cl. .................... 257/686; 257/723; 257/777; 361/790
(58) Field of Search .......................... 257/685, 686, 257/723, 777; 361/783, 790, 760

(56) References Cited

U.S. PATENT DOCUMENTS

| 3,959,047 | A | | 5/1976 | Alberts et al. |
| 4,617,160 | A | * | 10/1986 | Belanger et al. ............ 264/40.1 |
| 4,770,640 | A | | 9/1988 | Walter |
| 5,132,775 | A | | 7/1992 | Brighton et al. |
| 5,239,447 | A | | 8/1993 | Cotues et al. |
| 5,240,878 | A | | 8/1993 | Fitzsimmons et al. |
| 5,457,345 | A | | 10/1995 | Cook et al. |
| 5,668,409 | A | | 9/1997 | Gaul |
| 5,726,492 | A | | 3/1998 | Suzuki et al. |
| 5,783,864 | A | | 7/1998 | Dawson et al. |
| 5,783,870 | A | | 7/1998 | Mostafazadeh et al. |
| 5,793,116 | A | * | 8/1998 | Rinne et al. ................. 257/777 |
| 5,801,448 | A | | 9/1998 | Ball |
| 5,869,896 | A | * | 2/1999 | Baker et al. ................. 257/724 |
| 6,051,886 | A | | 4/2000 | Fogal et al. |
| 6,091,138 | A | | 7/2000 | Yu et al. |
| 6,094,356 | A | | 7/2000 | Fujisawa et al. |
| RE36,916 | E | | 10/2000 | Moshayedi |
| 6,136,689 | A | | 10/2000 | Farrar |
| 6,252,305 | B1 | | 6/2001 | Lin et al. |
| 6,433,413 | B1 | * | 8/2002 | Farrar ......................... 257/678 |
| 6,469,376 | B2 | * | 10/2002 | Vaiyapuri .................... 257/686 |
| 6,486,540 | B2 | * | 11/2002 | Senba et al. ................. 257/678 |
| 2001/0014524 | A1 | | 8/2001 | Farrar |

OTHER PUBLICATIONS

Packaging; Electronic Materials Handbook, vol. 1; 1989; pp. 301 & 440.

V.C. Marcotte, N.G. Koopman, P.A. Totta; Review of Flip Chip Bonding; Microelectronic Packaging Technology, Materials and Processes; Apr. 1989; pp. 73–81.

L Pfeiffer, K.W. West, and Y.H. Wong; Self–Aligned Controlled Collapse Chip Connect (SAC4); J. Electrochemical Soc.; vol. 134, No. 11; Nov. 1987; pp. 2940–2941.

* cited by examiner

Primary Examiner—Kamand Cuneo
Assistant Examiner—Lourdes Cruz
(74) Attorney, Agent, or Firm—Knobbe, Martens, Olson & Bear, LLP

(57) ABSTRACT

A multichip module that utilizes an angled interconnect to electrically interconnect chips in the module that are positioned at an angle relative to each other. The multichip module may comprise a first and second chips that are positioned in an orthogonal manner. The first and second chips are electrically interconnected via an interconnect structure comprising a first conductive pillar that extends from an outer surface of the first chip. A distal end of the first pillar is electrically connected to an outer surface of the second chip via a solder ball or another conductive pillar that is interposed between the distal end of the first conductive pillar and the second chip.

23 Claims, 4 Drawing Sheets

ANGLED EDGE CONNECTIONS FOR MULTICHIP STRUCTURES

RELATED APPLICATIONS

This application is a divisional application of U.S. application Ser. No. 09/944,957 filed Aug. 30, 2001. This application is also related to U.S. patent application Ser. No. 10/198,818, filed Jul. 18, 2002, entitled "Angled Edge Connections for Multichip Structures."

BACKGROUND OF THE INVENTION

1. Field of the Invention

The present invention relates to multichip structures and, in particular, to chip interconnections in multichip structures.

2. Description of the Related Art

Semiconductor manufacturers continually strive to increase the packaging density of integrated circuit chips, which has led to the development of high density multichip modules, such as three-dimensional multichip structures. Multichip structures generally comprise a plurality of integrated circuit chips that are adhered together in a stack formation so as to reduce the amount of space that the chips occupy inside a system. It is generally understood that each chip in the stack typically has a plurality of conductive input/output (I/O) contacts that are exposed on a lateral surface of at least one edge of the chip. The exposed contacts provide a plurality of conductive I/O interconnects for wire bonding the device to external chips and circuitry.

As a result of the increased device density of VLSI (Very-Large-Scale Integration) and ULSI (Ultra-Large-Scale Integration) integrated circuitry, wiring conductive interconnects between input/output (I.O.) terminals of stacked integrated circuit chips has become increasingly more complex. The limitations brought about by the finite quantity of available space on the surface of a multichip structure and the levels of conductive traces that are required to wire complex integrated circuitry, such as microprocessors, memory modules, etc., has limited the interconnectivity between chips in multichip structures that require high-density conductive I/O interconnects.

One method of interconnecting chips within multichip structures is through the use of the generally known process of wire bonding. The I/O interconnection process of wire bonding often requires the formation of bondable wire bonding pads, which provide electrical contacts to I/O vias in the insulation layer of an integrated circuit chip. Unfortunately, bondable wire bonding pads may be relatively large. In addition, the available space on a substrate surface for surface mounting conductive I/O interconnects is limited by the finite dimensions of the device. As a result, the disadvantage to wire bonding as a method of I/O interconnection between integrated circuit chips is that the bonding pads consume a large amount of the available space on the integrated circuit chip surface. Therefore, the fabrication density is limited by the dimensions of the wire bonding pad and further by the finite dimensions of the integrated circuit chip surface. To further increase the fabrication density of integrated circuitry, a manufacturing process that reduces the need for wire bonding as a means for establishing a conductive link between I/O interconnects would be preferred.

In another aspect, integrated circuits chips within a multichip structure may be interconnected by a direct solderable C4 connection, but the I/O interconnection surfaces are usually limited to an opposed parallel positioning of the integrated circuit chips. An opposing parallel position refers to a chip configuration where the bonding elements are interposed between two parallel bonding plane surfaces of two opposing chips, which is similar to a sandwich configuration. Disadvantageously, the opposing parallel configuration reduces interconnection and mounting flexibility and can only be applied to parallel oriented chips in multichip structures, which is likely to reduce the available I/O interconnect density for chips that are not parallel and adjacent to one another.

Hence, it will be appreciated that there is a need for a method of increasing the interconnect density and interconnection flexibility between chips in multichip modules. There is also a need for a method of electrically connecting chips that are not positioned in an opposing parallel fashion. To this end, there is a particular need for a multichip structure that provides an increased interconnect density and flexibility between chips that are not positioned parallel to one another.

SUMMARY OF THE INVENTION

In one aspect, the preferred embodiments of the present invention disclose an integrated circuit module comprising a first semiconductor structure having a first surface defined by a first plane and a second semiconductor structure having a second surface defined by a second plane, wherein the second structure is positioned adjacent the first structure in a manner such that the second plane intersects the first plane. The module further comprises a first connecting member extending from the first surface of first structure. Preferably, the first connecting member has a first distal end that is electrically connected to the first surface and a second distal end extending from the first surface along a first axis.

Preferably, the module also comprises a second connecting member that is interposed between the second distal end of the first connecting member and the second surface of the second structure, wherein the second connecting member electrically interconnects the second distal end to the second surface and forms a bond therebetween along a second axis. Preferably, the second axis is not parallel to the first axis. In one embodiment, the first connecting member comprises a conductive pillar and the second connecting member comprises a solder ball. In another embodiment, both the first and second connecting members comprise conductive pillars and the conductive pillars may be joined together via solder.

In another aspect, the preferred embodiments of the present invention disclose a multichip module comprising a plurality of semiconductor chips stacked and secured together to form a base structure wherein the base structure has a first and a second lateral face, wherein each lateral face is comprised of a portion of each chip, wherein the first lateral face is adjacent to and substantially perpendicular to the second lateral face. The module further comprises a first exterior semiconductor chip mounted to the first lateral face of the base structure in a manner such that a first surface of the first exterior chip is positioned adjacent to the first lateral face and extends across at least a portion of the first lateral face. Preferably, the module also comprises a second exterior semiconductor chip mounted to the second lateral face of the base structure in a manner such that a first surface of the second exterior chip is positioned adjacent to the second lateral face and extends across at least a portion of the second lateral face. The first and second exterior chips are electrically connected via a connecting member. Preferably, the connecting member comprises a first distal end that is electrically connected to the first surface of the first exterior chip and a second distal end that is electrically connected to the first surface of the second exterior chip. In one embodiment, the connecting member comprises a conductive pillar. A solder ball is preferably interposed between the second distal end of the connecting member and the first surface of the second semiconductor chip. In another embodiment, the first distal end of the connecting member extends along a first axis and the second distal end extends along a second axis, wherein the first axis and the second axis are non-parallel.

In yet another aspect, the preferred embodiments of the present invention is directed to a method of forming electrical interconnections between two integrate circuit structures. The method comprises forming a first conductive contact on a first surface of a first semiconductor chip and a second conductive contact on a second surface of a second semiconductor chip. The method further comprises forming a connecting member on the first contact wherein a distal end of the connecting member extends from the first surface of the first semiconductor chip. The method further comprises positioning the chips in a manner such that the plane defining the first surface intersects with plane the defining the second surface. Furthermore, the method comprises affixing the distal end of the connecting member to the second contact of the second chip to electrically connect the first and second semiconductor chips. In one embodiment, the distal end can be affixed to the second contact by interposing either a solder ball or a conductive pillar between the distal end and the second contact. In another embodiment, the conductive pillar can be formed by a selective CVD, electroless plating, electroplating, or a blanket deposition using a tape lift-off process. In yet another embodiment, the solder ball can be formed via a selective immersion, tape lift-off, or metal mask process and then reflowed in $H_2$.

Advantageously, the preferred embodiments of the present invention provide an increased interconnection flexibility between integrated circuit chips. In particular, densely packed multichip structures may be mounted and interconnected at an angular offset from each other, which also allows for a reduction of unused space within the structure and an adaptation to irregular shaped configurations. With increased interconnection flexibility, multichip structures may utilize a greater area of surface space for multichip interconnectivity and thus increase the interconnect density. The increased interconnect flexibility and density may result in an increase in speed of the multichip structure due to the increase in available I/O interconnections and a reduced conductive trace length between multiple chip I/O interconnections. These and other advantages of the present invention will become more fully apparent from the following description taken in conjunction with the accompanying drawings.

DETAILED DESCRIPTION OF THE PREFERRED EMBODIMENT

Figure 1:
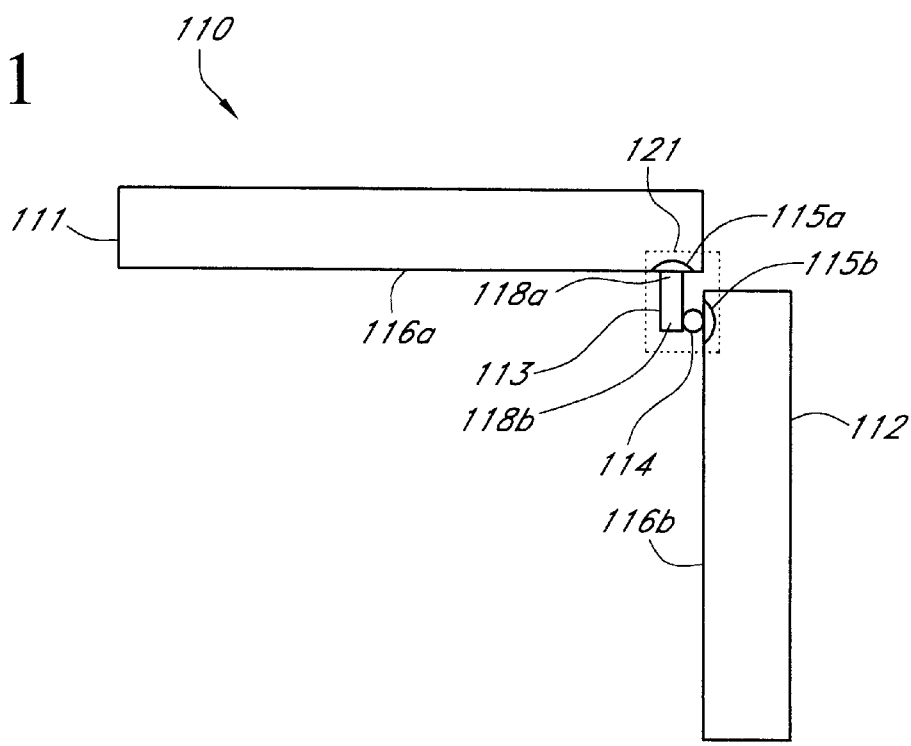
FIG. 1 provides a schematic illustration of a multichip structure of the preferred embodiment, showing the chips positioned at a substantially orthogonal angle and interconnected using the preferred interconnection method.

References will now be made to the drawings wherein like numerals refer to like parts throughout. FIG. 1 illustrates a multichip structure 110 of a preferred embodiment. The multichip structure 110 comprises a first integrated circuit chip 111 having a first surface 116a and a second integrated circuit chip 112 having a second surface 116b. As shown in FIG. 1, the chips 111, 112 are positioned in a manner such that the first surface 116a is substantially adjacent and orthogonal to the second surface 116b. As FIG. 1 further shows, a first conductive contact 115a is formed on the first chip 111 and a first connecting member 113 extends from the first contact 15a. Preferably, a second conductive contact 115b is also formed on the second chip 112 and a second connecting member 114 is interposed between the first connecting member 113 and the second contact 115b so as to establish electrical interconnection therebetween. Particularly, the first connecting member 113 has a first distal end 118a that is attached to the first contact 115a and a second distal end 118b that extends from the first surface 116a along a first axis. The second connecting member 114 is preferably interposed between the second distal end 118b and the second contact 115b so as to form a conductive bond therebetween. Preferably, the bond is formed along a second axis that is not parallel to the first axis.

In one embodiment, the first connecting member 113 is a conductive pillar comprising a conductive material, such as copper, while the second connecting member 114 may be a generally known solder ball used in C4 interconnections. In one embodiment, the solder ball 114 may be first formed on the second distal end 118b of the first connecting member 113 and then bonded to the second contact 115b on the second surface 116b. In another embodiment, the solder ball 114 may be first formed on the second contact 115b and then bonded to the second distal end 118b of the first connecting member 113. The advantage to using the conductive pillar 113 in conjunction with the solder ball 114 is that an angular conductive interconnection may be established between two semiconductor structures, such as the first and second chips 111, 112. Therefore, conductive interconnection between chips is not limited to chips positioned in an opposing parallel position.

As shown in FIG. 1, the first and second connecting members 113, 114 are joined together to electrically interconnect the chips 111, 112. In one embodiment, the first and second chips 111, 112 may comprise electrical devices such as logic gates, memory modules, capacitors, resistors, and the like. In another embodiment, the first and second chips 111, 112 may be replaced with insulator based wafers comprising a plurality of conductive traces for interconnection of electrical components between integrated circuit chips.

A preferred process for the fabrication of the multichip structure 110 shown in FIG. 1 may proceed as follows. The first and second chips 111, 112 are fabricated in accordance with conventional integrated circuit manufacturing processes. After the completion of the next to last layer of chip metallurgy, an insulating layer is deposited on the first and second chips 111, 112 and planarized using methods that are known in the art. A solderable metallurgy layer is then deposited on the insulating layer and photo processed to form the last level of conductive traces and/or conductive contact points. Preferably, the conductive contact points comprise the first and second conductive contacts 115a, 115b as shown in FIG. 1. In one embodiment, the contacts 115a, 115b comprise conductive pads that provide electrical interconnection to internal circuitry in the chips. Subsequent to forming the conductive contacts 115a, 115b, the conductive pillar 113 may be formed on the first contact 115a using selective CVD, electroless plating, electroplating or a blanket deposition in conjunction with a known tape life-off process. Similarly, the solder ball 114 may be formed on the second exposed contact 115b using generally known C4 (Controlled Collapsed Chip Connection) processes, in which a lift-off procedure is used to form the solder ball. Alternatively, the solder ball 114 may be formed on the second distal end 118b of the first connecting member 113 using several different known methods such as selective immersion, tape lift-off, or metal mask to deposit solder. In one embodiment, the process continues by reflowing the solder in $H_2$ to form a solder ball 114. The multichip module 110 may be subsequently mounted to an appropriate substrate, which may be the outer surface of a multichip stacked module as will be discussed further below.

Figure 2:
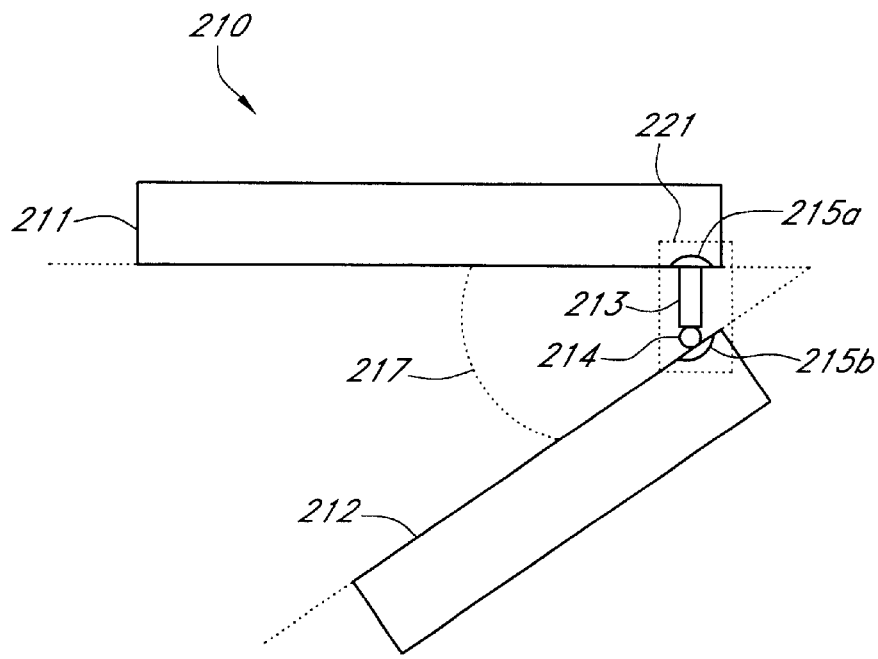
FIG. 2 provides a schematic illustration of another preferred embodiment of a multichip structure, showing the chips positioned at an acute angle and interconnected using the preferred interconnection method.

FIG. 2 illustrates another embodiment of a multichip structure 210 showing a second chip 212 positioned at an angular offset 217 from a first chip 211. In this embodiment, the angle 217 formed between the two chips 211, 212 is less than 90 degrees, however, it can be appreciated that this angle can vary without departing from the scope of the invention. In another embodiment, for example, the angle 217 may be greater than 90 degrees. As shown in FIG. 2, a conductive interconnection 221 between the two chips 211, 212 is achieved in a similar manner as the interconnection 121 illustrated in FIG. 1. Similar to the module illustrated in FIG. 1, the conductive interconnection 221 comprises a first connecting member 213 which extends from a first contact 215a formed on the first chip. A second connecting member 214, which preferably comprises a solder ball, is interposed between the first connecting member and a second contact 215b formed on the second chip 212. As illustrated in FIG. 2, if it is desired to attach the chips 211, 212 at an angular offset other than orthogonal as in FIG. 1, the same procedures may be used as in FIG. 1 except that the chips would be positioned at the desired angle prior to attaching the first connecting member to the second connecting member. These connections are especially useful in complex multichip stack modules, which will be discussed in further detail below. It should also be apparent to one skilled in the art that these connections can be adapted to structures using generally known C4 connections so that the contact between the chips may be secured at various angles.

Figure 3:
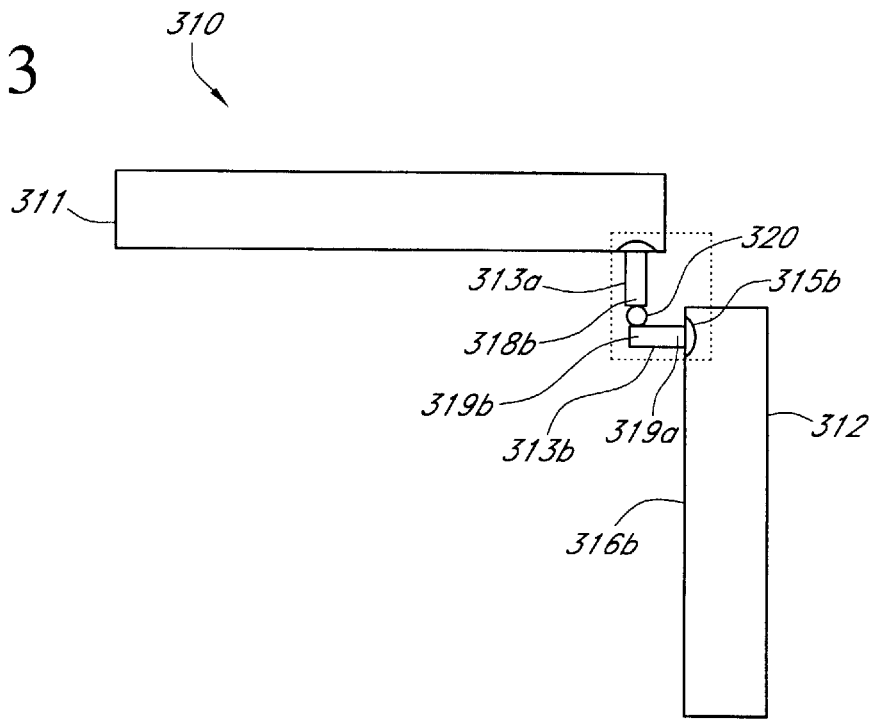
FIG. 3 provides a schematic illustration of another embodiment of the multichip structure of FIG. 1, showing another embodiment of the interconnection method.

FIG. 3 illustrates yet another embodiment of a multichip structure 310. In this embodiment, the multichip structure 310 comprises a second connecting member 313b that is also a conductive pillar having a first distal end 319a and a second distal end 319b. The first distal end 319a is attached to a second exposed contact 315b formed a second surface 316b of the second chip 312. Preferably, the second distal end 319b extends from the second surface 316b along an axis that is substantially orthogonal to the first connecting member 313a. The second distal end 319b of the second connecting member 313b is positioned adjacent to the second distal end 318b of the first connecting member 313a. Furthermore, a conductive bonding element 320 such as solder is used to electrically interconnect the second distal ends 318b, 319b of the connecting members 313a, 313b. The advantage to this particular embodiment is increased orientation flexibility, where the positioning of the first and second chips 311, 312 may form various angular displacements between the two chips 311, 312 without departing from the scope of the invention.

Figure 4:
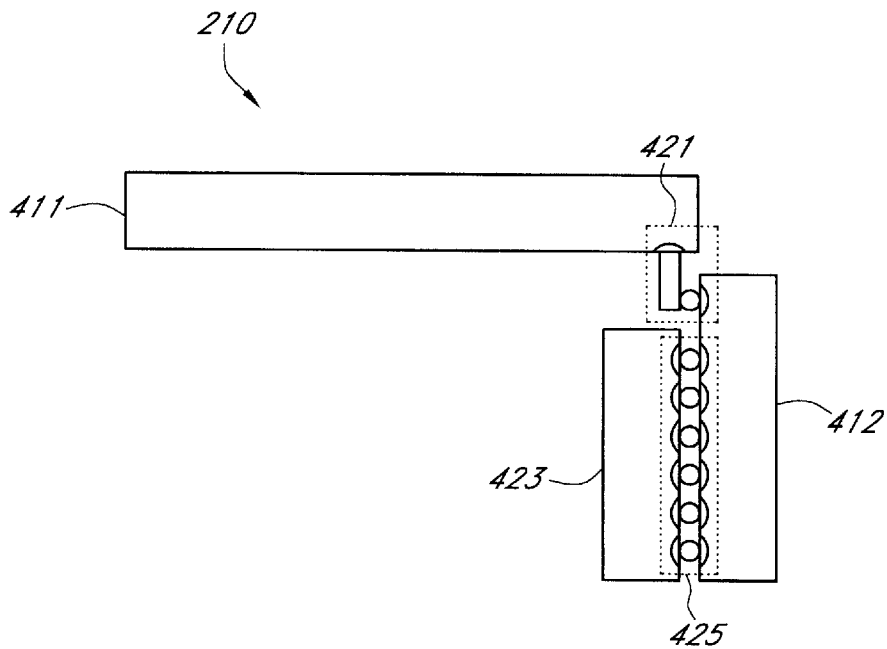
FIG. 4 illustrates a schematic illustration of yet another embodiment of a multichip structure, showing three chips interconnected to each other using one embodiment of the preferred interconnection method.

FIG. 4 illustrates still another embodiment of a multichip structure 410. The multichip structure 410 further includes a third chip 423. The third chip 423 is positioned substantially parallel to the second chip 412 and interconnected to the second chip 412 by way of a plurality of conductive interconnects 425. In one embodiment, the conductive interconnects 425 comprise conventional C4 solder connections. This particular embodiment illustrates the angular mounting of chips 411, 412 substantially orthogonal to each other via the conductive interconnection 421 described above and the simultaneous mounting of chips 412, 423 substantially parallel to each other via the conductive interconnection 425. The advantage to multiple chip mounting orientations is that chip interconnection density may be increased due to an increase in the chip mounting flexibility between chips 411, 412, 423. The advantage to this chip mounting configuration is that a plurality of planar structures may be simultaneously mounted in both angular and parallel configurations in one multichip structure.

Figure 5:
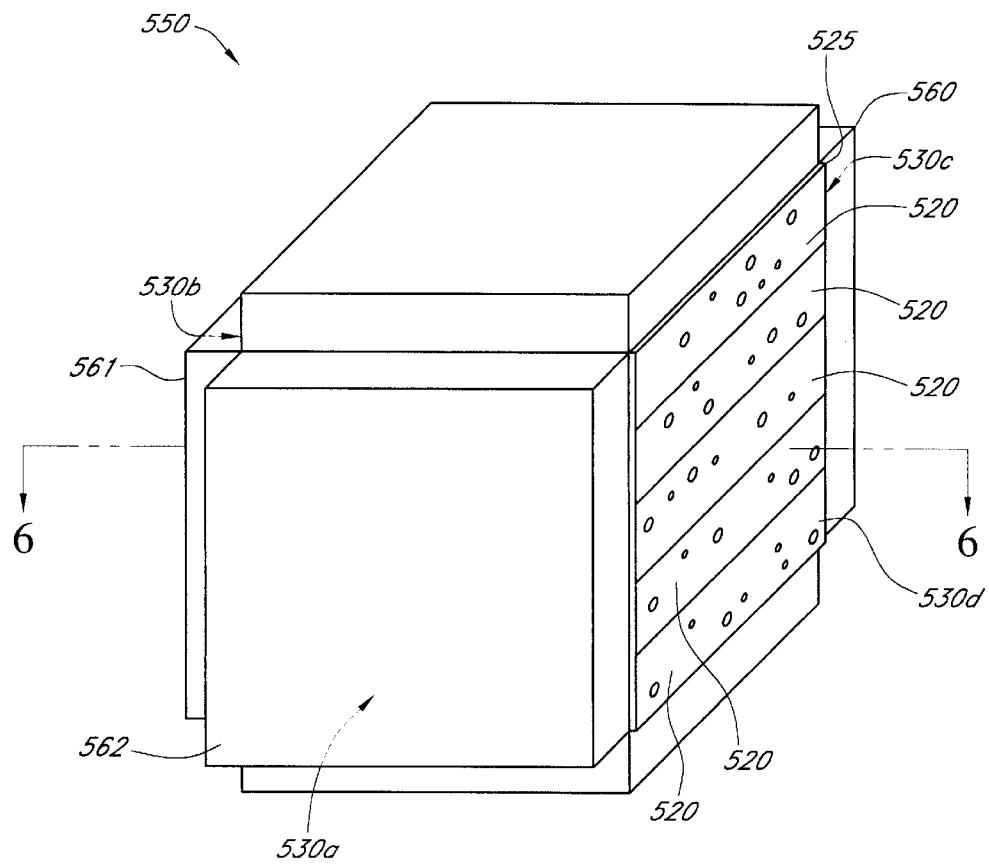
FIG. 5 illustrates a schematic illustration of one embodiment of a three-dimensional multichip module utilizing one embodiment of the preferred interconnection method.

FIG. 5 illustrates one embodiment of a three-dimensional multichip module 550, which utilizes the interconnection methods described above to interconnect the exterior chips of the module. As FIG. 5 shows, the multichip module 550 comprises a plurality of semiconductor chips 520 stacked and secured together to form a base structure 525, wherein the base structure has four lateral faces 530a–d (only one is shown). Preferably, each lateral face 530 is comprised of a portion of each chip. Preferably, a first lateral face 530a is adjacent to and substantially perpendicular to a second lateral face 530b, while a third lateral face 530c is adjacent to and substantially perpendicular to the second face 530b. As FIG. 5 shows, a first exterior semiconductor chip 562 is mounted to the first lateral face 530a of the base structure 525 in a manner such that a first surface (not shown) of the first exterior chip 562 is positioned adjacent to the first lateral face 530a and extends across at least a portion of the first lateral face 530a. Furthermore, a second exterior semiconductor chip 561 is mounted to the second lateral face 530b of the base structure 525 in a manner such that a first surface (not shown) of the second exterior chip 561 is positioned adjacent to the second lateral face 530b and extends across at least a portion of the second lateral face. Similarly, a third exterior chip 560 is mounted to the third lateral face 530c of the base structure 525 in a manner such that a first surface (not shown) of the third exterior chip 560 is positioned adjacent to the third lateral face 530c and extends across at least a portion of the third lateral face 530c. The multichip module 550 is described in detail in Applicant's co-pending U.S. Patent Application entitled "A THREE-DIMENSIONAL MULTICHIP MODULE AND METHOD OF MAKING THE SAME", which is incorporated by reference herein in its entirety.

Figure 6:
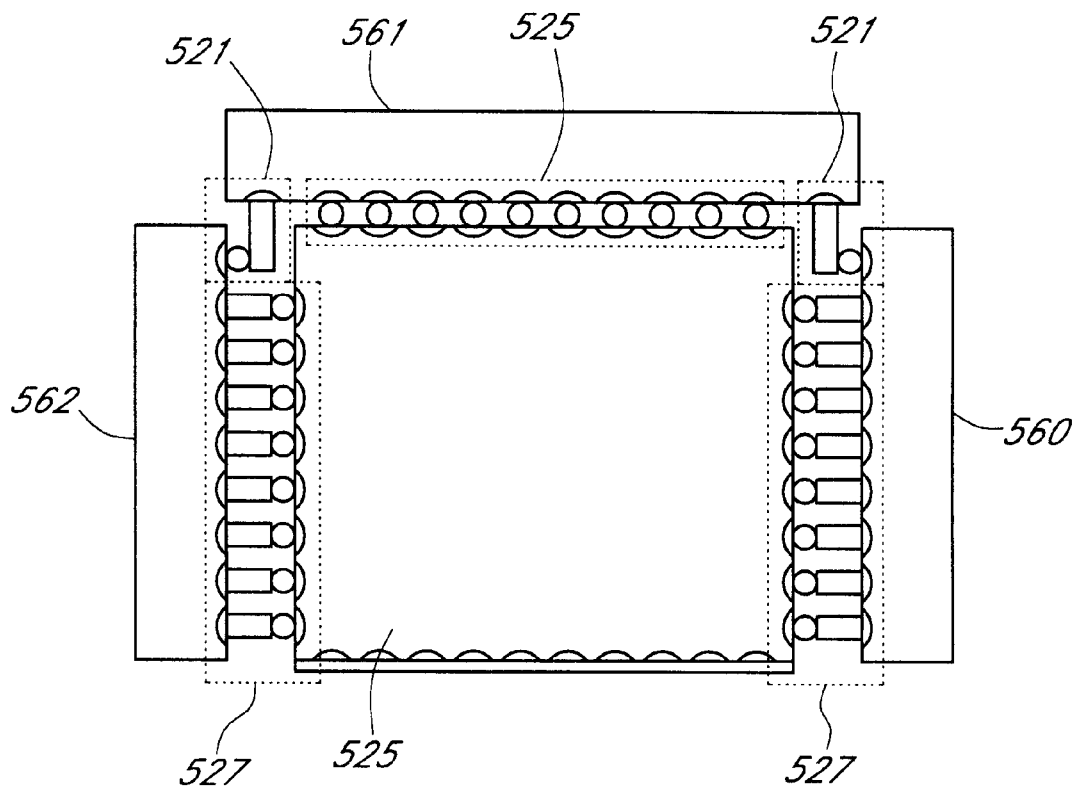
FIG. 6 illustrates a cross-sectional view of the three-dimensional multichip module in FIG. 5 taken along line 6—6.

FIG. 6 illustrates a cross-sectional view taken along the line 6—6 of the three-dimensional multichip module 550 shown in FIG. 5. FIG. 6 shows the three exterior chips 560, 561, 562 are interconnected with each other using conductive interconnects 521, 525, 527 of the preferred embodiments shown and described above in detail in FIGS. 1–4. As shown in FIG. 6, the exterior chips 560, 561, 562 are mounted in parallel with the exterior faces of the base structure 525 through the plurality of conductive interconnections 525, 527 and also orthogonal to each other through the conductive interconnections 521. In one embodiment, the exterior chips 560, 561, 562 are aligned, in a manner known in the art, prior to mounting to the base structure 525, and the module 550 is then heated in an inert or reducing atmosphere to the melting point of the solder used as connecting members.

The conductive interconnection 521 of the preferred embodiment allows for the exterior chips 560, 561, 562 to be interconnected to each other for an increased I/O interconnection density, wherein an increase in the speed of the device is achieved by increasing the number of available I/O interconnects. Another advantage gained is an increase in the interconnection flexibility of the multichip structure, whereby angled edge connections offer increased efficiency and performance of the multichip structural system. As such, the above-mentioned fabrication process significantly increases the I/O interconnect density and the interconnect flexibility of multichip stacked structures. A process and structure that allows solderable connections to be produced with an increased I/O density and increased I/O interconnect flexibility improves the efficiency and the performance of a multichip stacked structure.

Although the foregoing description of the various embodiments of the present invention have shown, described, and pointed out the fundamental novel features of the present invention, it will be understood that various omissions, substitutions, and changes in the form of the detail of the apparatus as illustrated as well as the uses thereof, may be made by those skilled in the art, without departing from the scope of the present invention. Consequently, the scope of the present invention should not be limited to the foregoing discussions, but should be defined by the appended claims.

What is claimed is:

1. An integrated circuit module, comprising:
    a first semiconductor structure having a first surface defined by a first plane;
    a second semiconductor structure having a second surface defined by a second plane, wherein the second structure is positioned adjacent the first structure in manner such that the second plane intersects the first plane;
    a first connecting member extending from the first surface of the first structure, the first connecting member having a first distal end electrically connected to the first surface and a second distal end extending from the first surface along a first axis; and
    a second connecting member interposed between the second distal end of the first connecting member and the second surface of the second structure, wherein the second connecting member electrically interconnects the second distal end to the second surface and forms a bond therebetween along a second axis, wherein the second axis is not parallel to the first axis.

2. The module of claim 1, wherein the second plane intersects the first plane at an approximately 90 degree angle.

3. The module of claim 1, wherein the second plane intersects the first plane at an angle greater than 90 degrees.

4. The module of claim 1, wherein the second plane intersects with the first plane at an angle less than 90 degrees.

5. The module of claim 1, wherein the first connecting member comprises a conductive pillar.

6. The module of claim 5, wherein the conductive pillar comprises copper.

7. The module of claim 5, wherein the second connecting member comprises a solder ball.

8. The module of claim 7, wherein the second connecting member comprises a C4 structure.

9. The module of claim 7, wherein the solder ball is formed on the second surface of the second semiconductor structure and extends from the second surface along the second axis to make contact with the second distal end of the first connecting member.

10. The module of claim 7, wherein the solder ball is formed on the second distal end of the first connecting member and extends from the second distal end along the second axis to make contact with the second surface of the second semiconductor structure.

11. The module of claim 1, further comprising a first conductive contact formed on the first surface of the first semiconductor structure, wherein the first distal end of the first connecting member is positioned adjacent to the first conductive contact.

12. The module of claim 11, wherein the first conductive contact comprises a conductive pad.

13. The module of claim 11, wherein the first conductive contact comprises a conductive via.

14. The module of claim 1, further comprising a second conductive contact formed on the second surface of the second semiconductor structure, wherein the second connecting member contacts the second conductive contact.

15. The module of claim 14, wherein the second conductive contact comprises a conductive pad.

16. The module of claim 15, wherein the second conductive contact comprises a conductive via.

17. The module of claim 14, wherein the second connecting member comprises a conductive pillar having a first distal end positioned adjacent to the second conductive contact and a second distal end extending from the second surface along the second axis.

18. The module of claim 17, wherein the second distal end of the first connecting member and the second distal end of the second connecting member are joined together via a solder joint.

19. The module of claim 18, wherein the first and second connecting members are joined together at an approximately 90 degree angle.

20. The module of claim 1, wherein the first semiconductor structure comprises an integrated circuit chip.

21. The module of claim 20, wherein the second semiconductor structure comprises an integrated circuit chip.

22. The module of claim 21, wherein the integrated circuit structure is adapted to be mounted to a multichip structure comprising a plurality of integrated circuit chips secured together in a stack.

23. The module of claim 20, wherein the integrated circuit structure is mounted to a third integrated circuit chip in a manner such that a first surface of the third chip is positioned adjacent and substantially parallel to the second surface of the second chip, wherein the third chip is electrically connected to the second surface via a plurality of solder contacts formed between the second and third chips.

* * * * *